(12) United States Patent
Sekizaki et al.

(10) Patent No.: US 7,908,102 B2
(45) Date of Patent: Mar. 15, 2011

(54) VOLTAGE MEASURING DEVICE

(75) Inventors: Masashi Sekizaki, Makinohara (JP); Kimihiro Matsuura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 428 days.

(21) Appl. No.: 12/216,787

(22) Filed: Jul. 10, 2008

(65) Prior Publication Data

US 2009/0063067 A1    Mar. 5, 2009

(30) Foreign Application Priority Data

Aug. 31, 2007   (JP) ................................. 2007-225711

(51) Int. Cl.
*G06F 19/00* (2006.01)
(52) U.S. Cl. ....................................................... 702/64
(58) Field of Classification Search .............. 702/65–66, 702/182–185, 188
See application file for complete search history.

(56) References Cited

U.S. PATENT DOCUMENTS

| | | | | |
|---|---|---|---|---|
| 2005/0038614 A1* | 2/2005 | Botts et al. | ....................... | 702/63 |
| 2008/0222431 A1* | 9/2008 | Paniagua et al. | .............. | 713/300 |
| 2008/0307240 A1* | 12/2008 | Dahan et al. | ................... | 713/320 |

FOREIGN PATENT DOCUMENTS

| JP | 2000-88898 | 3/2000 |
|---|---|---|
| JP | 2006-042591 | 2/2006 |

* cited by examiner

*Primary Examiner* — Edward Raymond
(74) *Attorney, Agent, or Firm* — Edwards Angell Palmer & Dodge LLP (57) ABSTRACT

A base of a pnp transistor Tr1 is connected to an isolation device $D_1$, an emitter thereof is connected to a cathode of a high voltage battery $B_H$, and a collector thereof is connected to an anode of the high voltage battery $B_H$. Npn transistors Tr21 to Tr2n are provided respectively to blocks $B_1$ to $B_n$. Bases of the npn transistors Tr21 to Tr2n are connected to the collector of the transistor Tr1, emitters thereof are connected to anodes of corresponding blocks $B_1$ to $B_n$, and collectors are connected to awakening terminals of high voltage measuring circuits 11 to 1n.

2 Claims, 5 Drawing Sheets

VOLTAGE MEASURING DEVICE

CROSS REFERENCE TO RELATED APPLICATIONS

This application is on the basis of Japanese Patent Application No. 2007-225711, the contents of which are hereby incorporated by reference.

BACKGROUND OF THE INVENTION

1. Field of the Invention

The present invention relates to a voltage measuring device, in particular, including: a plurality of voltage measuring members respectively provided at blocks composed of series-connected unit cells made of secondary batteries composing an assembled battery for measuring voltages across the unit cells composing the blocks; and a control member for receiving measured results of the voltages across the unit cells via communication with the voltage measuring members.

2. Description of the Related Art

In these days, a hybrid vehicle (hereafter referred to as HEV) which uses both an engine and an electric motor becomes widely used. This HEV includes a low voltage battery about 12 V for starting the engine, and a high voltage battery for driving the electric motor. This high voltage battery is made of series-connected unit cells. The unit cell is a secondary battery such as nickel hydride battery or lithium battery.

After repeating charge and discharge cycles of the high voltage battery, a voltage across each unit cell, namely, a state of charge (SOC) is varied. With regard to the charge and discharge of the battery, in view of endurance of the battery and safety ensuring, when the unit cell having the highest SOC reaches an upper limit, the charge is stopped, and when the unit cell having the lowest SOC reaches a lower limit, the discharge is stopped. Accordingly, when the SOCs of the unit cells are varied, an enabled capacity of the battery is substantially reduced. Therefore, in the HEV, so called assistance and regeneration of the battery become insufficient, and a moving performance and mileage are reduced. Consequently, for equalizing the SOCs of the unit cells, the voltages across the unit cells should be measured.

Figure 6:
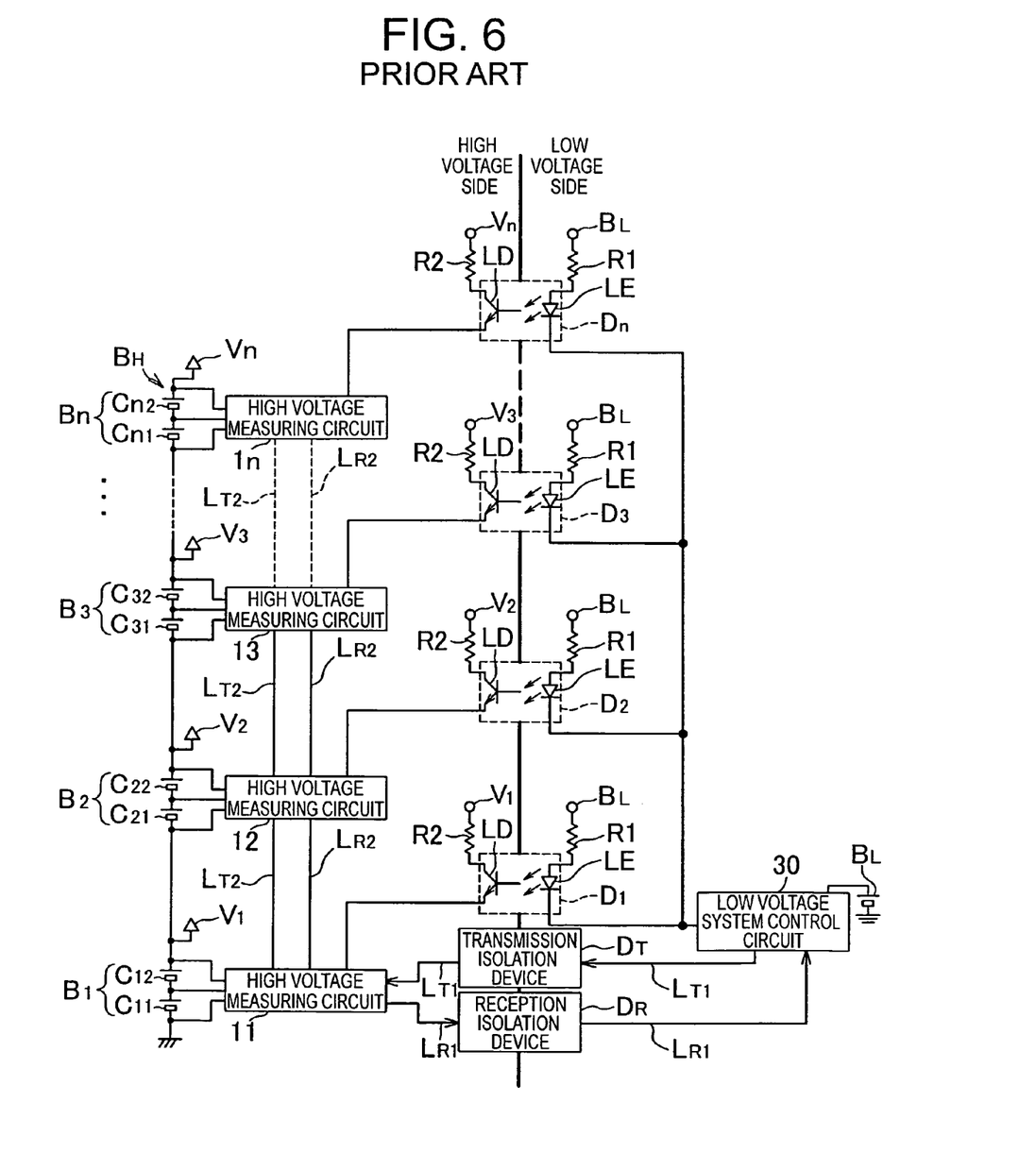
FIG. 6 is a circuit diagram showing a conventional voltage measuring device.

FIG. 6 shows a conventional voltage measuring device for measuring voltages across the unit cells composing the high voltage battery (Patent Document 1, 2). Reference number $B_L$ indicates a low voltage battery. As shown in FIG. 6, for example, the low voltage battery $B_L$ is composed of one secondary battery.

Further, reference numeral $B_H$ indicates a high voltage battery. The high voltage battery is used as a battery for the electric motor of the HEV. The electric motor as a load is connected to both ends of the high voltage battery as necessary, and an alternator as a charger is connected to both ends of the high voltage battery as necessary.

The high voltage battery $B_H$ is divided to blocks $B_1$ to $B_n$ (n: arbitrary integral number). Each block of $B_1$ to $B_n$ is, for example, composed of two unit cells $C_{11}$ to $C_{n2}$. The voltage measuring device includes high voltage measuring circuits 11 to 1n as a high voltage measuring member, and a low voltage system control circuit 30 as a controlling member. The low voltage system control circuit 30 is powered by the low voltage battery $B_L$ and controls the high voltage measuring circuits 11 to 1n. The high voltage measuring circuits 11 to 1n are provided corresponding to the blocks $B_1$ to $B_n$. The high voltage measuring circuits 11 to 1n are powered by the unit cells $C_{11}$ to $C_{n2}$ of corresponding block $B_1$ to $B_n$ from among the blocks $B_1$ to $B_n$, and measures the voltage across the unit cells $C_{11}$ to $C_{n2}$ of the corresponding block $B_1$ to $B_n$. Namely, cathodes of corresponding blocks $B_1$ to $B_n$ are ground levels and the high voltage measuring circuits 11 to 1n have different ground levels. Thus, a device having a low breakdown voltage can be used for composing the high voltage measuring circuits 11 to 1n.

The high voltage measuring circuit 11 is connected to the low voltage system control circuit 30 via a transmitting line $L_{T1}$ and a receiving line $L_{R1}$. A transmission isolation device $D_T$ such as a photo-coupler is provided on the transmitting line $L_{T1}$. Owing to this transmission isolation device $D_T$, while the high voltage measuring circuit 11 is isolated from the low voltage system control circuit 30, the low voltage system control circuit 30 can send a measuring order to the high voltage measuring circuit 11. Further, a reception isolation device $D_R$ such as a photo-coupler is provided on the receiving line $L_{R1}$. Owing to this reception isolation device $D_R$, while the high voltage measuring circuit 11 is isolated from the low voltage system control circuit 30, the low voltage system control circuit 30 can receive a measured result from the high voltage measuring circuit 11.

Further, the high voltage measuring circuits 11 to 1n are serially connected to each other via a transmission line $L_{T2}$ and a reception line $L_{R2}$. The high voltage measuring circuit 11 sends the measuring order received from the low voltage system control circuit 30 to the high voltage measuring circuits 11 to 1n via the transmission line $L_{T2}$. The high voltage measuring circuits 11 to 1n send the measured result to the high voltage measuring circuit 11 via the reception line $L_{R2}$. The high voltage measuring circuit 11 sends the measured result received from the high voltage measuring circuits 11 to 1n via the reception line $L_{R2}$ to the low voltage system control circuit 30.

For example, after receiving the measured results of the unit cells $C_{11}$ to $C_{n2}$ corresponding to an ignition off, the low voltage system control circuit 30 sends a sleep order to the high voltage measuring circuits 11 to 1n via the transmitting line $L_{T1}$. In this sleep mode, the high voltage measuring circuits 11 to 1n stop a communication with the low voltage system control circuit 30 to reduce a dark current at the ignition off of a vehicle. Further, when the low voltage system control circuit 30 provide an awakening signal to a not-shown awakening terminal, the sleep mode of the high voltage measuring circuits 11 to 1n is exited even while a communication function does not work.

Next, a structure to send the awakening signal to respective high voltage measuring circuits 11 to 1n will be explained. In the voltage measuring device, isolation devices $D_1$ to $D_n$ are provided corresponding to the blocks $B_1$ to $B_n$. Each of isolation devices $D_1$ to $D_n$ includes a light emitting device LE and a photo receiver LD. One end of the light emitting device LE is connected to the low voltage battery $B_L$ via a resistor R1, and the other end of the light emitting device LE is connected to the low voltage system control circuit 30. Further, one end of the photo receiver LD is connected to an anode $V_1$ to $V_n$ of corresponding blocks $B_1$ to $B_n$ via a resistor R2, and the other end of the photo receiver LD is connected to the awakening terminal of the high voltage measuring circuits 11 to 1n.

When the low voltage system control circuit 30 outputs a low level awakening signal, the light emitting device LE of the isolation devices $D_1$ to $D_n$ emits light. When the light emitting device LE emits light, the photo receiver LD conducts and a high level awakening signal is supplied to the high voltage measuring circuits 11 to 1n. Because the photo receivers LDs are connected to the anodes $V_1$ to $V_n$ of the blocks $B_1$ to $B_n$, the ground levels of the awakening signals differs. Corresponding to a supply of the awakening signals, the high voltage measuring circuits 11 to 1n cancel the sleep mode and restart the communication with the low voltage system control circuit 30.

However, in the above-described voltage measuring device, for supplying the awakening signals having different ground levels, the isolation devices $D_1$ to $D_n$ are needed corresponding to the number of the blocks $B_1$ to $B_n$. Therefore, owing to an increase of the number of parts, there is a problem that cost of the voltage measuring device increases, and a packaging size of the voltage measuring device increases.

[Patent Document 1] Japanese Published Patent Application No. 2000-88898

[Patent Document 2] Japanese Published Patent Application No. 2006-42591

Accordingly, an object of the present invention is to provide a voltage measuring device to allow the number of parts to reduce, so that the cost and the package size may be reduced.

SUMMARY OF THE INVENTION

In order to attain the object, according to the present invention, there is provided a voltage measuring device comprising:

a plurality of voltage measuring members respectively provided at blocks composed of series-connected unit cells made of secondary batteries composing an assembled battery for measuring voltages across the unit cells composing the blocks; and a control member for receiving measured results of the voltages across the unit cells via communication with the voltage measuring members, wherein when the voltage measuring members receive a sleep order via communication with the control member, the voltage measuring members enter a sleep mode in which the voltage measuring members stop the communication with the control member, wherein when an awakening signal is inputted to an awakening terminal, the sleep mode is exited, and the voltage measuring members restart the communication with the control member, wherein the voltage measuring member includes:

an isolation device to output a high level awakening signal isolated from the control member corresponding to the awakening signal from the control member;

a first semiconductor switch having a first control terminal to which the high level awakening signal is inputted from the isolation device, a first terminal connected to an anode of the assembled battery, and a second terminal connected to a cathode of the assembled battery, a junction between said first and second terminals conducting when the high level awakening signal is inputted to the first control terminal; and a plurality of second semiconductor switches provided corresponding to the blocks, wherein the second semiconductor switch has a second control terminal connected to the first terminal of the first semiconductor switch, a third terminal connected to an anode of the corresponding block, and a fourth terminal connected to the awakening terminal, a junction between said third and fourth terminals conducting when the second control terminal is connected to the cathode of the assembled battery.

Preferably, the first semiconductor switch is an npn transistor or an n-type field-effect transistor, and the second semiconductor switch is a pnp transistor or a p-type field-effect transistor.

These and other objects, features, and advantages of the present invention will become more apparent upon reading of the following detailed description along with the accompanied drawings.

DETAILED DESCRIPTION OF THE PREFERRED EMBODIMENTS

Figure 1:
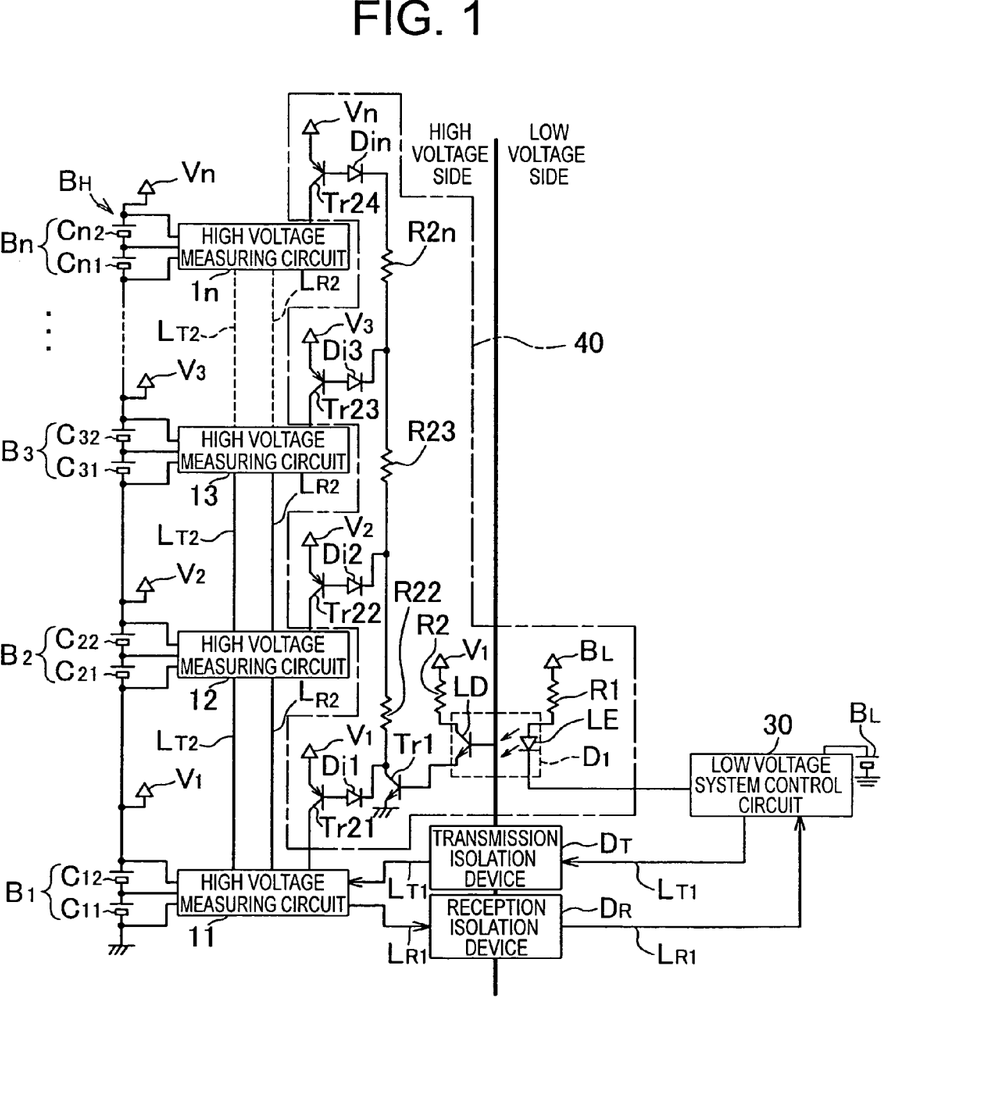
FIG. 1 is a block diagram showing an embodiment of a voltage measuring device according to the present invention.

Hereafter an embodiment according to the present invention will be explained with reference to figures. Reference number $B_L$ indicates a low voltage battery. As shown in FIG. 1, for example, the low voltage battery $B_L$ is composed of one secondary battery. The low voltage battery $B_L$ is used as a voltage source for a starter to start an engine, and an alternator as a charger is connected to both ends of the low voltage battery $B_L$.

Further, reference numeral $B_H$ indicates a high voltage battery as an assembled battery. The high voltage battery is used as a battery for the electric motor of the HEV. The electric motor as a load is connected to both ends of the high voltage battery as necessary, and an alternator as a charger is connected to both ends of the high voltage battery as necessary.

The high voltage battery $B_H$ is divided to blocks $B_1$ to $B_n$ (n: arbitrary integral number). Each block of $B_1$ to $B_n$ is, for example, composed of two unit cells $C_{11}$ to $C_{n2}$. The voltage measuring device includes high voltage measuring circuits 11 to 1n as a high voltage measuring member, a low voltage system control circuit 30 as a controlling member, and an awakening signal output circuit 40. The low voltage system control circuit 30 is powered by the low voltage battery $B_L$ and controls the high voltage measuring circuits 11 to 1n.

The high voltage measuring circuits 11 to 1n are provided corresponding to the blocks $B_1$ to $B_n$. The high voltage measuring circuits 11 to 1n are powered by the unit cells $C_{11}$ to $C_{n2}$ of corresponding block $B_1$ to $B_n$ from among the blocks $B_1$ to $B_n$, and measures the voltage across the unit cells $C_{11}$ to $C_{n2}$ of the corresponding block $B_1$ to $B_n$. Namely, cathodes of corresponding blocks $B_1$ to $B_n$ are ground levels and the high voltage measuring circuits 11 to 1n have different ground levels. Thus, a device having a low breakdown voltage can be used for composing the high voltage measuring circuits 11 to 1n.

Figure 2:
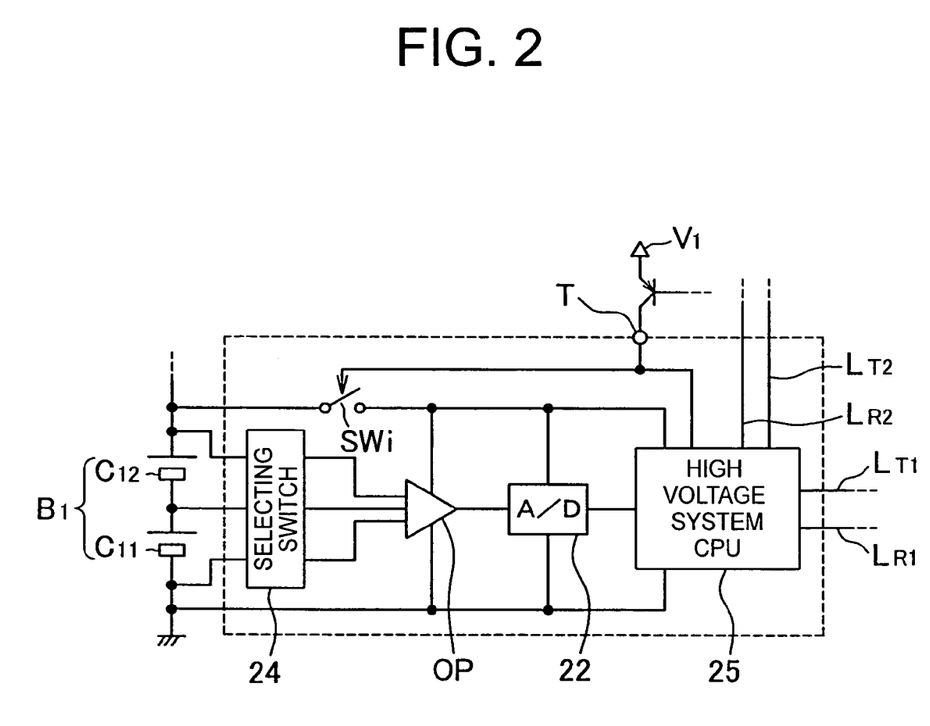
FIG. 2 is a circuit diagram showing a detail of a high voltage measuring circuit shown in FIG. 1.

Next, a structure of the high voltage measuring circuits 11 to 1n will be explained with reference to FIG. 2. FIG. 2 is a circuit diagram showing a detail of a high voltage measuring circuit shown in FIG. 1. Because the high voltage measuring circuits 12 to 1n are substantially similar to the high voltage measuring circuit 11, a detailed circuit diagram thereof is omitted. As shown in FIG. 2, each of the high voltage measuring circuits 11 to 1n includes: a differential amplifier OP for measuring the voltages across the unit cells $C_{11}$ to $C_{n2}$ composing the corresponding blocks $B_1$ to $B_n$; selecting switches 24 for connecting both ends of one of the unit cells $C_{11}$ to $C_{n2}$ to the differential amplifier OP; an A/D convertor 22 for digital converting the voltage measured by the differential amplifier OP; and a high voltage system CPU 25 for controlling the selecting switches 24. The selecting switches 24 are composed of the switches provided at both ends of the unit cells $C_{11}$ to $C_{n2}$.

Further, power lines of the differential amplifier OP, the A/D convertor 22, and the high voltage system CPU 25 are connected to anodes of corresponding blocks $B_1$ to $B_n$, and ground lines of the differential amplifier OP, the A/D convertor 22, and the high voltage system CPU 25 are connected to cathodes of corresponding blocks $B_1$ to $B_n$. A breakdown switch SWi is provided on each power line. When the breakdown switch SWi is on, electric power is supplied to the differential amplifier OP, the A/D convertor 22, and the high voltage system CPU 25, and the differential amplifier OP, the A/D convertor 22, and the high voltage system CPU 25 start operating. On the other hand, when the breakdown switch SWi is off, the electric power supplied to the differential amplifier OP, the A/D convertor 22, and the high voltage system CPU 25 is stopped, and the differential amplifier OP, the A/D convertor 22, and the high voltage system CPU 25 stop operating. The high voltage system CPU 25 controls on/off of the breakdown switch SWi. An awakening signal supplied to a later-described awakening terminal T also controls on/off of the breakdown switch SWi.

The high voltage system CPU 25 of the high voltage measuring circuit 11 is connected to the low voltage system control circuit 30 via a transmitting line $L_{T1}$ and a receiving line $L_{R1}$. A transmission isolation device $D_T$ such as a photo-coupler is provided on the transmitting line $L_{T1}$. Owing to this transmission isolation device $D_T$, while the high voltage measuring circuit 11 is isolated from the low voltage system control circuit 30, the low voltage system control circuit 30 can send a measuring order to the high voltage measuring circuit 11. Further, a reception isolation device $D_R$ such as a photo-coupler is provided on the receiving line $L_{R1}$. Owing to this reception isolation device $D_R$, while the high voltage measuring circuit 11 is isolated from the low voltage system control circuit 30, the low voltage system control circuit 30 can receive a measured result from the high voltage measuring circuit 11. Further, the high voltage system CPU 25 of the high voltage measuring circuits 11 to 1n are serially connected to each other via a transmission line $L_{T2}$ and a reception line $L_{R2}$.

The low voltage system control circuit 30 is composed of, for example, CPU of a microcomputer, and controls operations of the high voltage measuring circuits 11 to 1n. As shown in FIG. 1, the awakening signal output circuit 40 includes: an isolation device $D_1$ composed of a photocoupler; an npn transistor Tr1 as a first semiconductor switch; pnp transistors Tr21 to Tr2n as second semiconductor switches; and rectifying diodes Di1 to Din.

The isolation device $D_1$ has a light emitting device LE and a photo receiver LD. One end of the light emitting device LE is connected to the low voltage battery $B_L$ via a resistor R1, and the other end of the light emitting device LE is connected to the low voltage system control circuit 30. Further, one end of the photo receiver LD is connected to an anode $V_1$ of corresponding block $B_1$ via a resistor R2, and the other end of the photo receiver LD is connected to a base of the transistor Tr1.

When the low voltage system control circuit 30 outputs a low level awakening signal, the light emitting device LE of the isolation devices $D_1$ emits light. When the light emitting device LE emits light, the photo receiver LD conducts and a high level awakening signal isolated from the low voltage system control circuit 30 is supplied to the base of the transistor Tr1.

The npn type transistor Tr1 includes: the base (first control terminal) to which the high level awakening signal is inputted from the isolation device $D_1$; a collector (first terminal) connected to the anode $V_n$ of the high voltage battery $B_H$ via the resistors R22 to R2n; and an emitter (second terminal) connected to a cathode of the high voltage battery $B_H$. When the high level awakening signal is inputted to the base, the collector-emitter junction of the transistor Tr1 conducts.

The pnp type transistors Tr21 to Tr2n are provided corresponding to the blocks $B_1$ to $B_n$. Each of the transistors Tr21 to Tr2n includes: a base (second control terminal) connected to the collector of the transistor Tr1 via the rectifying diodes Di1 to Din; an emitter (third terminal) connected to anodes V1 to Vn of corresponding blocks $B_1$ to $B_n$; and a collector (fourth terminal) connected to the awakening terminal T. Further, resistors R22 to R2n are interposed between the bases of the transistors Tr21 to Tr2n. In each of the transistors Tr21 to Tr2n, when the base is connected to the cathode of the high voltage battery $B_H$, the collector-emitter junction conducts, and the high level awakening signal is outputted to the awakening terminal T.

Figure 3:
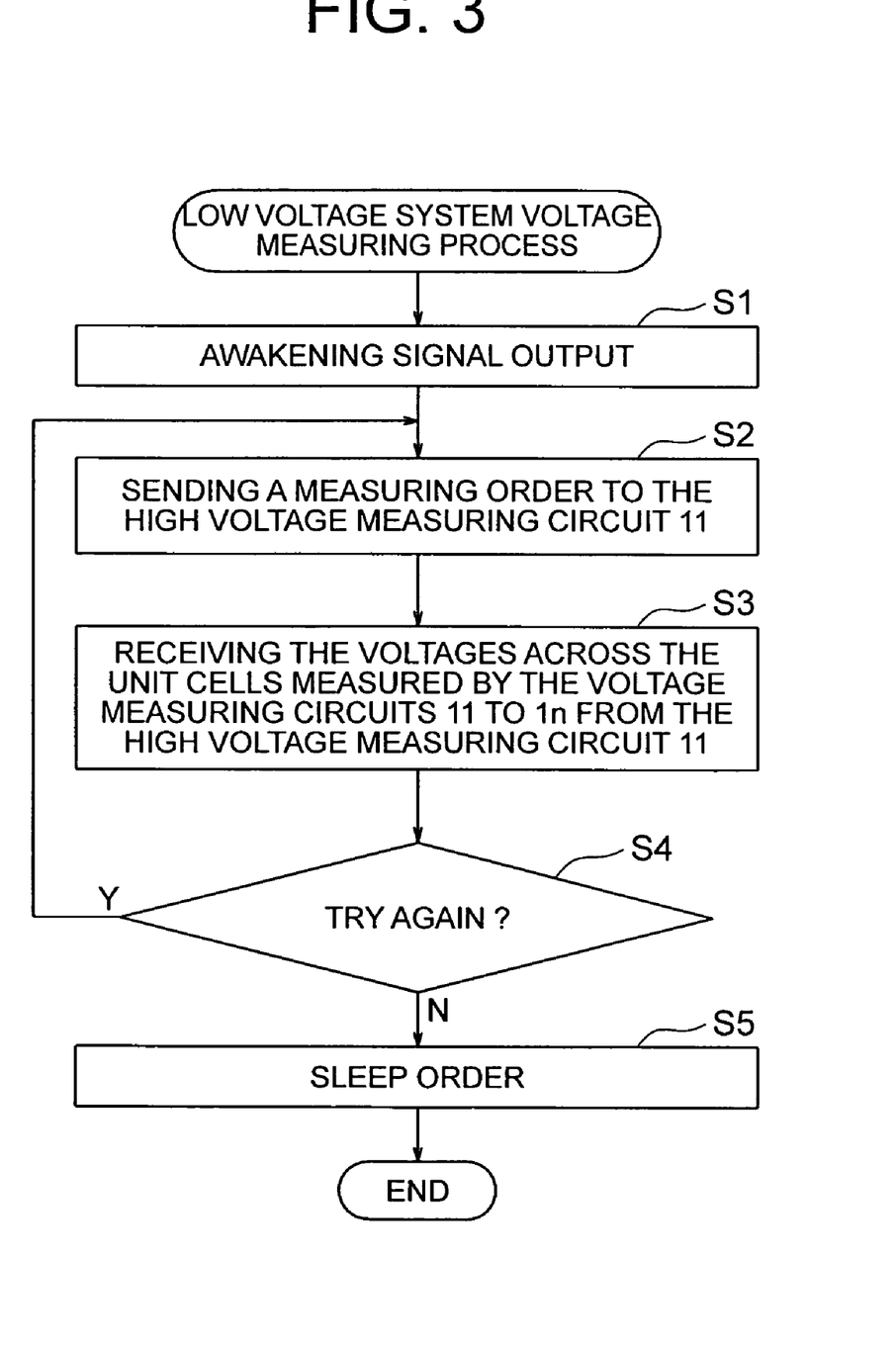
FIG. 3 is a flowchart showing a process flow of a low voltage system control circuit shown in FIG. 1.
Figure 4:
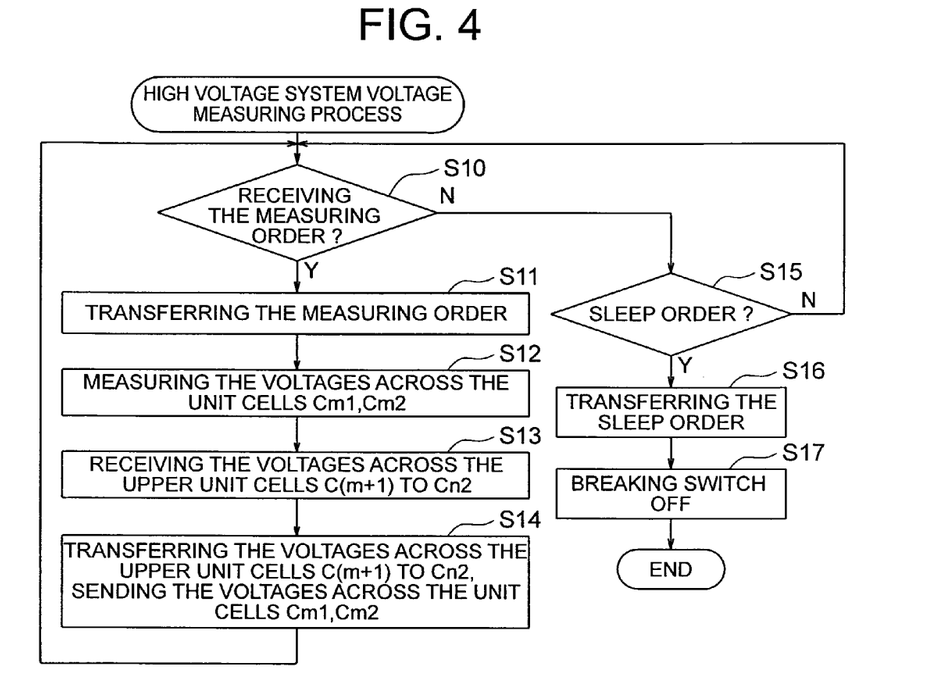
FIG. 4 is a flowchart showing a process flow of a high voltage system CPU.
Figure 5:
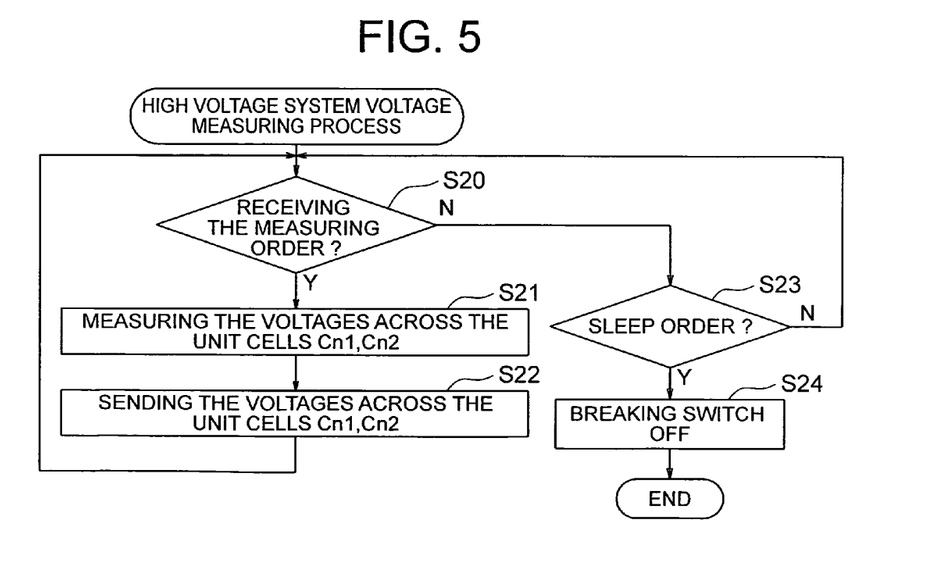
FIG. 5 is a flowchart showing another process flow of a high voltage system CPU.

Next, an operation of the high voltage measuring circuits 11 to 1n having the above-described structure will be explained with reference to FIGS. 3 to 5. FIG. 3 is a flowchart showing a process flow of the low voltage system control circuit 30 shown in FIG. 1. FIGS. 4 and 5 are flowcharts showing process flows of a high voltage system CPU 25.

When ignition on, the low voltage system control circuit 30 starts a low voltage system voltage measuring process shown in FIG. 3. At this time, the breakdown switch SWi in each of the high voltage measuring circuits 11 to 1n is off. Therefore, the high voltage system CPU 25 is not powered, and the high voltage measuring circuits 11 to 1n are in sleep mode, and cannot communicate with the low voltage system control circuit 30. For releasing the sleep mode, the low voltage system control circuit 30 outputs the low level awakening signal to the isolation device $D_1$ (step S1).

When the low level awakening signal is outputted, the light emitting device LE in the isolation device $D_1$ emits light. When the photo receiver LD in the isolation device $D_1$ receives the light emitted from the light emitting device LE, the photo receiver LD conducts to supply the high level awakening signal isolated from the low voltage system control circuit 30 into the base of the transistor Tr1. When the high level awakening signal is supplied to the base, the emitter-collector junction conducts, and the base of each of the transistors Tr21 to Tr2n is connected to the cathode of the high voltage battery $B_H$ (grounded).

When the base of each of the transistors Tr21 to Tr2n is connected to the cathode of the high voltage battery $B_H$, the emitter-collector junction of each of the transistors Tr21 to Tr2n conducts, and the high level awakening signal is supplied to the awakening terminal T of each of high voltage measuring circuits 11 to 1n. When the high level awakening signal is supplied to the awakening terminal T, the breakdown switch SWi of each of high voltage measuring circuits 11 to 1n is turned on, and the differential amplifier OP, A/D convertor 22, and the high voltage system CPU 25 are powered. Then, the sleep mode of the high voltage system CPU 25 of each of the high voltage measuring circuits 11 to 1n is exited, and a high voltage system voltage measuring process shown in FIGS. 4 and 5 starts.

Next, the low voltage system control circuit 30 sends a measuring order to the high voltage measuring circuit 11 (step S2). The measuring order is sent to the high voltage system CPU 25 of the high voltage measuring circuit 11 via the transmitting line $L_{T1}$ and the transmission isolation device $D_T$. When the high voltage system CPU 25 of the high voltage measuring circuit 11 receives the measuring order ("Y" in step S10), the high voltage system CPU 25 transfers the measuring order to the upper high voltage measuring circuit 12 (step S11). When the high voltage system CPU 25 of each of the high voltage measuring circuits 11 to 1(n−1) executes the above steps S10, S11, all the high voltage measuring circuits 11 to 1n receive the measuring order.

Then, the high voltage system CPU 25 of an arbitrary high voltage measuring circuit 1m among the high voltage measuring circuits 11 to 1(n−1) measures the voltages across the unit cells $C_{m1}$, $C_{m2}$ composing the corresponding block $B_m$ by controlling the selecting switches 24 (step S12). Further, when the high voltage system CPU 25 of the highest high voltage measuring circuit 1n receives the measuring order ("Y" in step S20 in FIG. 5), the high voltage system CPU 25 measures the voltages across the unit cells $C_{n1}$, $C_{n2}$ composing the corresponding block $B_n$ (step S21), then the high voltage system CPU 25 sends the measured voltages across the unit cells $C_{n1}$, $C_{n2}$ to the high voltage system CPU 25 of the lower high voltage measuring circuit 1(n−1) (step S22). Then, the flow goes back to step S20.

On the other hand, the high voltage system CPU 25 of an arbitrary high voltage measuring circuit 1m among the high voltage measuring circuits 11 to 1(n−1) receives voltages across the unit cells $C_{(m+1)}$ to $C_{n2}$ sent from the upper high voltage measuring circuit 1(m+1) (step S13). Then, the high voltage measuring circuits 12 to 1(n−1) transfer the voltages across the unit cells $C_{(m+1)1}$ to $C_{n2}$ received at step S13, and send the voltages across the unit cells Cm1, Cm2 received at step S12 to the lower high voltage measuring circuits 1(m−1) (step S14). Then, the flow goes back to step S10. When the high voltage measuring circuits 12 to 1(n−1) execute these steps S12 and S13, the voltages across the unit cells $C_{21}$ to $C_{n2}$ are sent to the high voltage system CPU 25 of the high voltage measuring circuit 11. Further, the high voltage system CPU 25 in the high voltage measuring circuit 11 transfers the received voltages across the unit cells $C_{21}$ to $C_{n2}$, and sends the voltages across the unit cells $C_{11}$, $C_{12}$ measured at step S12 to the low voltage system control circuit 30 (step S14). Then, the flow goes pack to step S10.

When the low voltage system control circuit 30 receives the voltages across all the unit cells $C_{11}$ to $C_{n2}$ sent from the high voltage measuring circuit 11 (step S3), the low voltage system control circuit 30 compares the voltages across the unit cells $C_{11}$ to $C_{n2}$. If the measured voltages are varied, the low voltage system control circuit 30 outputs an equalization order to a not-shown equalization device, and when the low voltage system control circuit 30 receives an equalization end signal from the equalization device, the low voltage system control circuit 30 judges that a second voltage measurement is necessary ("Y" in step S4). Then, the flow goes back to step S1. On the other hand, if the measured voltages are not varied, the low voltage system control circuit 30 judges that the second voltage measurement is not necessary ("N" in step S4), and outputs a sleep order to the high voltage measuring circuit 11 via the transmitting line $L_{T1}$ and the transmission isolation device $D_T$ (step S5).

When the high voltage system CPU 25 of the high voltage measuring circuit 11 receives the sleep order sent from the low voltage system control circuit 30 ("Y" in step S15), the high voltage system CPU 25 of the high voltage measuring circuit 11 transfers the sleep order to the high voltage system CPU 25 of the upper high voltage measuring circuit 12 (step S16), then, turns off the breakdown switch SWi (step S17) to end the high voltage system voltage measuring process. Thus, power supply to the high voltage system CPU 25 is shut out, and the system turns to the sleep mode in which the high voltage system CPU 25 is unable to communicate with the low voltage system control circuit 30.

Further, when the high voltage system CPU 25 of the arbitrary high voltage measuring circuit 1m among the high voltage measuring circuit 12 to 1(n−1) receives the sleep order from the high voltage system CPU 25 of the lower high voltage measuring circuit 1(m−1) ("Y" in step S15), the high voltage system CPU 25 of the arbitrary high voltage measuring circuit 1m transfers the sleep order to the high voltage system CPU 25 of the upper high voltage measuring circuit 1(m+1) (step S16), then, turns off the breakdown switch SWi (step S17), and the high voltage system voltage measuring process ends. When the high voltage system CPU 25 of each of the high voltage measuring circuits 12 to 1(n−1) executes step S15 and S16, the sleep order is sequentially transferred from the high voltage system CPU 25 of the high voltage measuring circuit 12 to the high voltage system CPU 25 of the high voltage measuring circuit 1n.

On the other hand, when the high voltage system CPU 25 of the highest high voltage measuring circuit 1n receives the sleep order from the high voltage system CPU 25 of the lower high voltage measuring circuit 1(n−1) ("Y" in step S23), the high voltage system CPU 25 of the highest high voltage measuring circuit 1n turns off the breakdown switch SWi (step S24) and the high voltage system voltage measuring process ends. Thus, all the high voltage measuring circuit 11 to 1n turn to the sleep mode in which the high voltage system CPU 25 is unable to communicate with the low voltage system control circuit 30.

According to the above-described voltage measuring device, when the isolation device $D_1$ outputs the high level awakening signal, the transistor Tr1 conducts and the bases of the transistors Tr21 to Tr21n are connected to the cathode of the high voltage battery $B_H$. Thus, each of transistors Tr21 to Tr2n conducts, and the awakening signals having different ground levels can be outputted to the high voltage measuring circuits 11 to 1n. Therefore, without providing the isolation devices at respective blocks $B_1$ to $B_n$, the awakening signals can be outputted to the high voltage measuring circuits 11 to 1n. Therefore, by reducing the number of electric parts, cost of the voltage measuring device is reduced, and a packaging size of the voltage measuring device is reduced.

Further, according to the above-described voltage measuring device, npn type transistor Tr1 as the first semiconductor switch and pnp type transistor Tr2 as the second semiconductor switch are used. Therefore, a structure of the voltage measuring device is simple, and the cost of the voltage measuring device is reduced.

Incidentally, according to the above-described voltage measuring device, npn type transistor Tr1 as the first semiconductor switch and pnp type transistor Tr2 as the second semiconductor switch are used. However, the present invention is not limited to this. For example, an n-type field effect transistor can be used as the first transistor switch, and a p-type field effect transistor can be used as the second field effect transistor.

Further, according to the above-described voltage measuring device, in sleep mode, the differential amplifier OP, the A/D convertor 22, and the high voltage system CPU 25 are powered off. However, the present invention is not limited to this. In sleep mode, at least the communication between the high voltage measuring circuits 11 to 1*n* and the low voltage system control circuit 30 is stopped. In sleep mode, the differential amplifier OP and the A/D convertor 22 may be powered on.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A voltage measuring device comprising:
a plurality of voltage measuring members respectively provided at blocks composed of series-connected unit cells made of secondary batteries composing an assembled battery for measuring voltages across the unit cells composing the blocks; and
a control member for receiving measured results of the voltages across the unit cells via communication with the voltage measuring members,
wherein when the voltage measuring members receive a sleep order via communication with the control member, the voltage measuring members enter a sleep mode in which the voltage measuring members stop the communication with the control member,
wherein when an awakening signal is inputted to an awakening terminal, the sleep mode is exited, and the voltage measuring members restart the communication with the control member,
wherein the voltage measuring member includes:
an isolation device to output a high level awakening signal isolated from the control member corresponding to the awakening signal from the control member;
a first semiconductor switch having a first control terminal to which the high level awakening signal is inputted from the isolation device, a first terminal connected to an anode of the assembled battery, and a second terminal connected to a cathode of the assembled battery, a junction between said first and second terminals conducting when the high level awakening signal is inputted to the first control terminal; and
a plurality of second semiconductor switches provided corresponding to the blocks,
wherein the second semiconductor switch has a second control terminal connected to the first terminal of the first semiconductor switch, a third terminal connected to an anode of the corresponding block, and a fourth terminal connected to the awakening terminal, a junction between said third and fourth terminals conducting when the second control terminal is connected to the cathode of the assembled battery.

2. The voltage measuring device as claimed in claim 1, wherein the first semiconductor switch is an npn transistor or an n-type field-effect transistor, and the second semiconductor switch is a pnp transistor or a p-type field-effect transistor.

* * * * *